(12) United States Patent
Yataka et al.

(10) Patent No.: US 8,530,930 B2
(45) Date of Patent: Sep. 10, 2013

(54) SEMICONDUCTOR DEVICE HAVING PLURAL INSULATED GATE SWITCHING CELLS AND METHOD FOR DESIGNING THE SAME

(75) Inventors: Shinichi Yataka, Tochigi (JP); Masatoshi Goto, Tochigi (JP)

(73) Assignee: Honda Motor Co., Ltd., Tokyo (JP)

( * ) Notice: Subject to any disclaimer, the term of this patent is extended or adjusted under 35 U.S.C. 154(b) by 5 days.

(21) Appl. No.: 13/238,490

(22) Filed: Sep. 21, 2011

(65) Prior Publication Data

US 2012/0091502 A1    Apr. 19, 2012

(30) Foreign Application Priority Data

Oct. 15, 2010    (JP) .................................. 2010-232610

(51) Int. Cl.
*H01L 29/66*    (2006.01)
(52) U.S. Cl.
USPC ............................ 257/139; 257/147; 257/372
(58) Field of Classification Search
USPC .......................................... 257/139, 147, 372
See application file for complete search history.

(56) References Cited

U.S. PATENT DOCUMENTS 5,089,864 A * 2/1992 Sakurai .......................... 257/144
5,170,239 A * 12/1992 Hagino .......................... 257/139

FOREIGN PATENT DOCUMENTS

JP    10-112541    4/1998

* cited by examiner

*Primary Examiner* — Kyoung Lee
*Assistant Examiner* — Ratisha Mehta
(74) *Attorney, Agent, or Firm* — Rankin, Hill & Clark LLP

(57) ABSTRACT

In a semiconductor device including a plurality of insulated gate switching cells each of which has a gate electrode, an emitter electrode that is commonly provided to cover the plurality of insulated gate switching cells, and a bonding wire connected to the emitter electrode, a gate driving voltage being applied to the gate electrode of each insulated gate switching cell so that emitter current flows through the emitter electrode, mutual conductance of each insulated gate switching cell is varied in accordance with the distance from the connection portion corresponding to the bonding position of the bonding wire so that the emitter current flowing through the emitter electrode is substantially equal among the plurality of insulated gate switching cells.

4 Claims, 8 Drawing Sheets

I – I

SEMICONDUCTOR DEVICE HAVING PLURAL INSULATED GATE SWITCHING CELLS AND METHOD FOR DESIGNING THE SAME

INCORPORATION BY REFERENCE

The present application claims priority under 35 U.S.C. §119 to Japanese Patent Application No. 2010-232610 filed on Oct. 15, 2010. The content of the application is incorporated herein by reference in its entirety.

BACKGROUND OF THE INVENTION

1. Field of the Invention

The present invention relates to a semiconductor device for use in a power converter such as an inverter or the like, and a method of designing the semiconductor device.

2. Description of Related Art

An insulated gate type semiconductor device is used for a power converter such as an inverter for large current or the like, and IGBT (Insulated Gate Bipolar Transistor) is typically known as an element for the insulated gate type semiconductor device, for example. Furthermore, a semiconductor device having plural IGBT cells which are provided in a stripe-like arrangement or a mesh-like arrangement to reduce ON voltage is also known. An emitter electrode common to some IGBT cells is provided on the surface of the thus-constructed semiconductor device, and plural bonding wires extending from peripheral electrodes provided on the periphery of the semiconductor device are bonded and electrically connected to the emitter electrode at suitable intervals.

Furthermore, it is known that when latch-up occurs in such a semiconductor device, large current flows through each bonding wire, and the current density just below the bonding wire becomes larger than that at the circumference of the bonding wire, so that the IGBT cells just below the bonding wires are broken.

A technique of suppressing the current density just below bonding wires by improving the imbalance of a current distribution in the semiconductor device is disclosed in JP-A-10-112541, for example.

According to the disclosure of this technique, it is indicated that the wire resistance between the emitter electrode of an IGBT and a bonding wire is lower as the IGBT cell concerned is nearer to the bonding wire. In other words, larger current loss occurs between the emitter electrode of an IGBT cell and the bonding wire due to relatively large wire resistance as the IGBT cell concerned is farther away from the bonding wire, however, current loss is small in an IGBT cell just below the bonding wire. As a result, it is suggested that a nonuniform current distribution having a peak just below the bonding wire is obtained.

Furthermore, according to the technique described above, current loads of the respective IGBT cells which are different in accordance with the distance from the bonding wire are made uniform so that the current distribution uniform is uniform. In order to make the current load uniform among the IGBT cells, the IGBT cells are designed so that the size of the IGBT cell is reduced to increase the current density at a place which is far away from the bonding wire and at which the current load is small. Conversely, the size of the IGBT cell is increased to lower the current density at a place which is near to the bonding wire and at which the current load is large. Accordingly, the current distribution is made uniform in the semiconductor device, and the concentration of current just below the bonding wires can be suppressed.

However, the difference in wire resistance between the IGBT cell at the place far away from the bonding wire and the IGBT cell at the place near to the bonding wire is not so large that it does not remarkably affect the difference between current loses of these IGBT cells. Therefore, the current distribution cannot be sufficiently made uniform by varying the size of the IGBT cell in accordance with the distance from the bonding wire, and thus the current density just below the bonding wire cannot be suppressed. In addition, when the size of the IGBT cell is varied in accordance with the distance from the bonding wire, the circuit design and manufacturing process are cumbersome.

SUMMARY OF THE INVENTION

The present invention has been implemented in view of the foregoing situation, and has an object to provide a semiconductor device that can make a current distribution in a semiconductor device uniform without varying the size of IGBT cells.

In order to attain the above object, according to an aspect of the present invention, a semiconductor device comprises: a plurality of insulated gate switching cells each of which has a gate electrode; an emitter electrode that is commonly provided to cover the plurality of insulated gate type switching cells; and a bonding wire connected to the emitter electrode, a gate driving voltage being applied to the gate electrode of each insulated gate switching cell so that emitter current flows through the emitter electrode, wherein the gate type driving voltage to be applied to the gate electrode of each insulated gate switching cell is varied in accordance with a distance from a connection position of the bonding wire to the emitter electrode of the insulated gate switching cell, so that the emitter current flowing through the emitter electrode varies in accordance with the distance concerned, and mutual conductance of each insulated gate switching cell is varied in accordance with the distance of the insulated gate switching cell from the connection portion so that the emitter current flowing through the emitter electrode is substantially equal among the plurality of insulated gate switching cells.

In the above semiconductor device, each insulated gate switching cell may comprise a base layer, an emitter layer formed in the base layer, the gate electrode formed on the emitter layer through an insulated layer and the emitter electrode formed on the emitter layer, and the mutual conductance of each insulated gate switching cell may be varied by varying an occupancy rate of the emitter layer in the base layer.

In the above semiconductor device, the occupancy rate of the emitter layer in the base layer may be varied by varying the emitter width of the emitter layer.

In the above semiconductor device, the emitter width of each insulated gate switching cell may be larger as the insulated gate switching cell is farther away from the connection portion.

According to another aspect of the present invention, a method of designing a semiconductor device having a plurality of insulated gate switching cells each of which has a base layer, an emitter layer formed in the base layer, a gate electrode formed on the emitter layer through an insulated layer and an emitter electrode which is commonly formed on the emitter layers of the plurality of insulated gate switching cells, and a bonding wire connected to the emitter electrode, a gate driving voltage being applied to the gate electrode of each insulated gate switching cell so that emitter current flows through the emitter electrode, comprises: forming the emitter layer in the base layer of each insulated gate switching cell so that emitter width thereof is larger as the insulated gate switching cell is farther away from the connection portion of the bonding wire to the emitter electrode, whereby the emitter current flowing through the emitter electrode is substantially equal among the plurality of insulated gate switching cells.

According to the present invention, even when a difference occurs in gate driving voltage in accordance with the distance from the connection position of the bonding wire, the mutual conductance of each switching cell is varied in accordance with this difference, whereby the emitter current can be made equal among the respective switching cells. Accordingly, the current distribution can be made uniform in the semiconductor device. In addition, the current density at the connection position of the bonding wire is not higher than those at the other places, and thus the switching cells can be prevented from being broken at the connection position when latch-up occurs can be prevented. Therefore, resistance to latch-up can be enhanced. Furthermore, it is unnecessary to vary the size of the switching cell, and thus the circuit design and manufacturing process are not cumbersome.

Furthermore, the mutual conductance of each insulated gate switching cell is varied by varying the emitter width of the insulated gate switching cell, whereby the mutual conductance of each insulated gate switching cell can be simply and accurately adjusted.

DETAILED DESCRIPTION OF PREFERRED EMBODIMENT

A preferred embodiment according to the present invention will be described hereunder with reference to the accompanying drawings.

Figure 1:
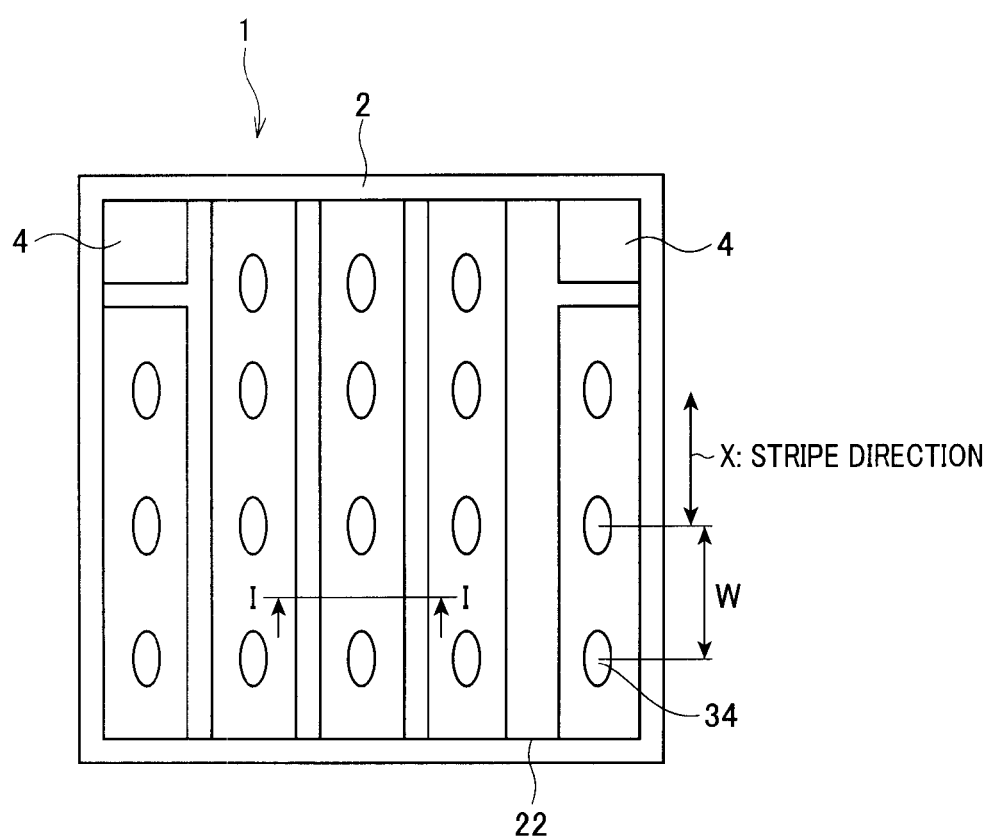
FIG. 1 is a diagram showing a planar configuration of a semiconductor device according to an embodiment of the present invention.
Figure 2:
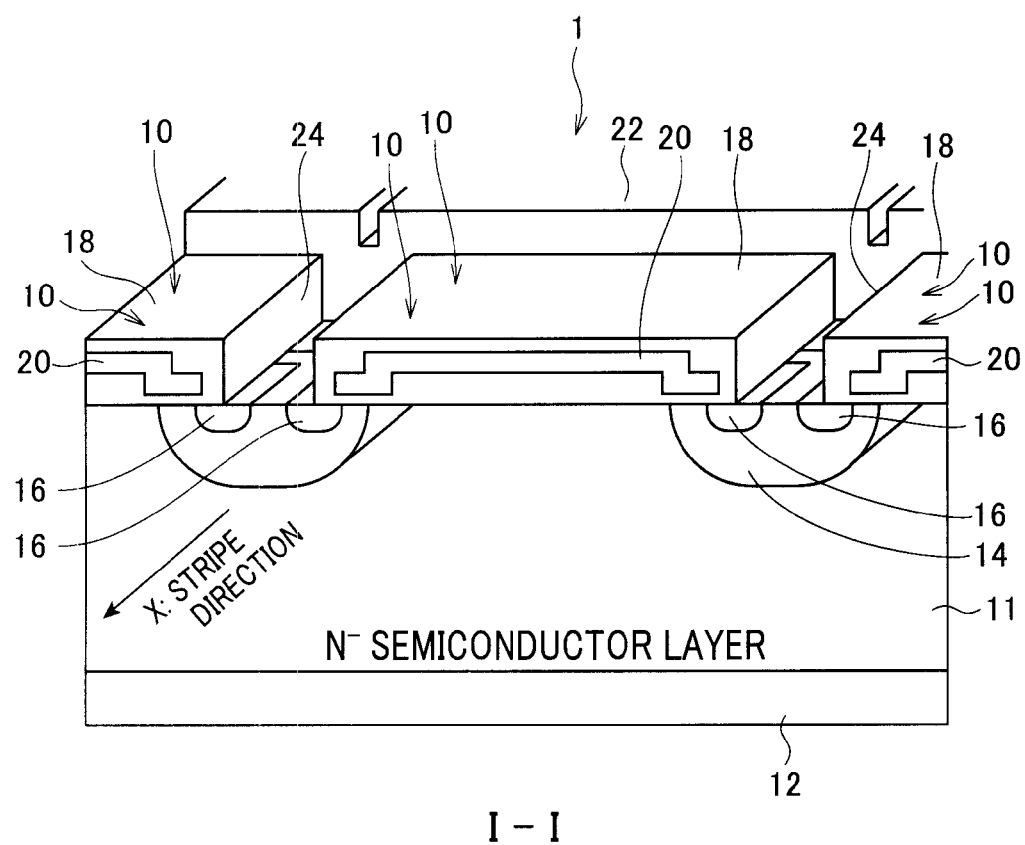
FIG. 2 is a diagram showing the cross-sectional construction of I-I line of FIG. 1, and also a partially cut-out perspective view of a cell structure formed in the semiconductor device 1.

FIG. 1 is a diagram showing the planar construction of a semiconductor device 1 according to an embodiment. FIG. 2 is a diagram showing the cross-sectional construction of I-I line of FIG. 1, and is a partially cut-out perspective view of a cell structure formed in the semiconductor device 1.

The semiconductor device 1 has a semiconductor substrate 2, and many IGBT cells 10 (FIG. 2) as insulated gate switching cells are formed in the semiconductor substrate 2 so as to be arranged in parallel in a stripe-like form. Gate pads 4 to be electrically connected to gate electrodes 20 (FIG. 2) of plural IGBT cells 10 are intensively formed at two corner portions of the semiconductor substrate 2.

As shown in FIG. 2, the semiconductor device 1 is constructed as follows. That is, a p-type P collector layer 12 as a second conduction type collector layer is provided on one surface (back surface) of an n-type N-semiconductor layer 11 as a first conduction type semiconductor layer, and p-type P base layers 14 as second conduction type base regions are selectively formed to be arranged in a stripe-like form on the other surface (upper surface). Furthermore, n-type N emitter layers 16 as first conduction type are selectively formed in the regions of the P base layers 14 so as to be arranged at fixed intervals in the same direction as the stripe direction X of the P base layers 14, and gate electrodes 20 and an emitter electrode 22 are formed through an insulating layer 18 on the N emitter layers 16.

Contact openings 24 are formed in the insulating layer 18 so as to extend in a stripe-like form in parallel to the N emitter layers 16 so that the N emitter layers 16 are exposed through the contact openings 24. The emitter electrode 22 comes into contact with the N emitter layers 16 through the contact openings 24. The emitter electrode 22 is formed of an electrical conducting material such as aluminum or the like, for example, and provided on the insulating layer 18 so as to cover the surface of the semiconductor device 1. According to this construction, plural IGBT cells 10 are formed at both the sides of each contact opening 24 and arranged in the stripe direction X so that each contact opening 24 is sandwiched by the IGBT cells 10. Accordingly, the IGBT cells 10 are provided in a mesh-like form on the surface of the semiconductor device 1.

As described above, each IGBT cell 10 is covered by the common emitter electrode 22, whereby collector-emitter current of each IGBT cell 10 flows to the emitter electrode 22. High electrically conductive bonding wires 32 (FIG. 3) are connected to the emitter electrode 22 at a predetermined interval W every column of IGBT cells 10 which are arranged in a stripe-like form. The respective IGBT cells 10 are electrically connected to peripheral electrodes (not shown) provided on the periphery of the semiconductor device 1 through the bonding wires 32.

Figure 3:
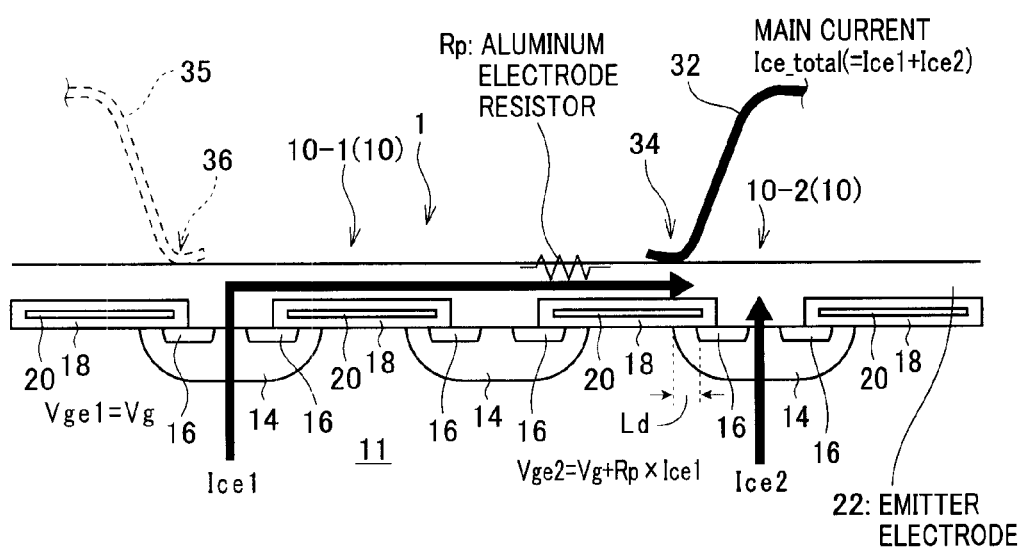
FIG. 3 is a cross-sectional view showing the construction of the semiconductor device in the neighborhood of a connection portion of a bonding wire.

FIG. 3 is a cross-sectional view showing the construction of the semiconductor device 1 in the neighborhood of the connection portion 34 of the bonding wire 32.

With respect to the thus-constructed semiconductor device 1, if no countermeasure is taken, collector-emitter current Ice would be larger in an IGBT cell 10 as the IGBT cell 10 is nearer to the connection portion 34 of the bonding wire 32, and thus the current density of the current flowing through the IGBT cell 10 concerned is higher, so that this IGBT cell 10 is broken. As a result of inventors' devoted studies, the following knowledge has been achieved as a factor of increasing the current density as the IGBT cell 10 is nearer to the connection portion 34 of the bonding wire 32.

That is, a difference occurs in gate-emitter voltage Vge as a gate driving voltage between an IGBT cell 10 nearer to the connection portion 34 of the bonding wire 32 and an IGBT cell 10 farther away from the connection portion 34 of the bonding wire 32. That is, the gate-emitter voltage Vge is higher in the IGBT cell 10 nearer to the connection portion 34 of the bonding wire 32 than that in the IGBT cell 10 farther away from the connection portion of the bonding wire 32. As a result, collector-emitter current Ice larger than a designed value flows through the IGBT cell 10 which is nearer to the connection portion 34 of the bonding wire 32, and thus current is nonuniform among IGBT cells 10.

Figure 4:
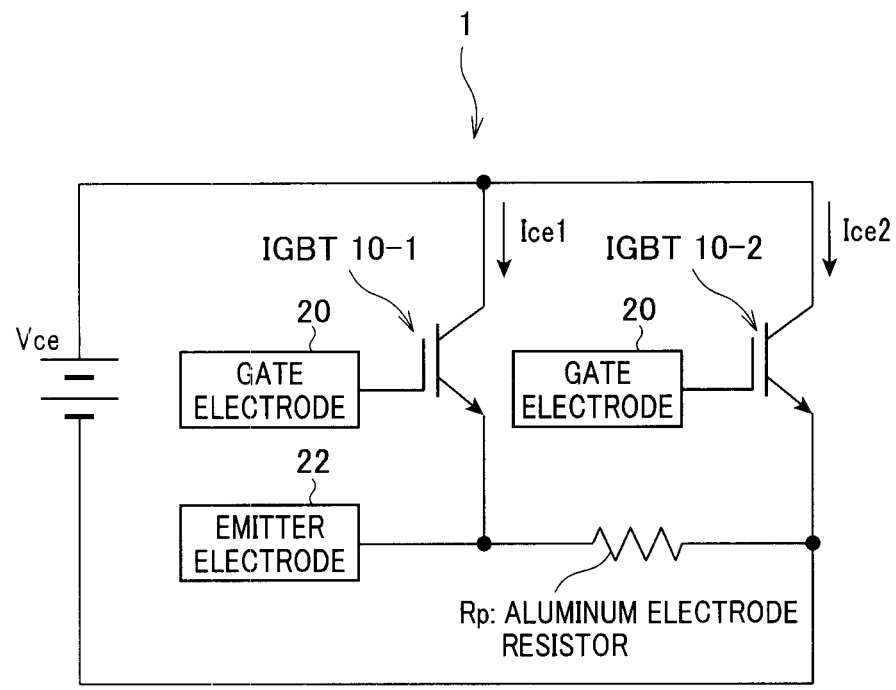
FIG. 4 is an equivalent circuit diagram of an IGBT cell equipped to the semiconductor device.
Figure 5:
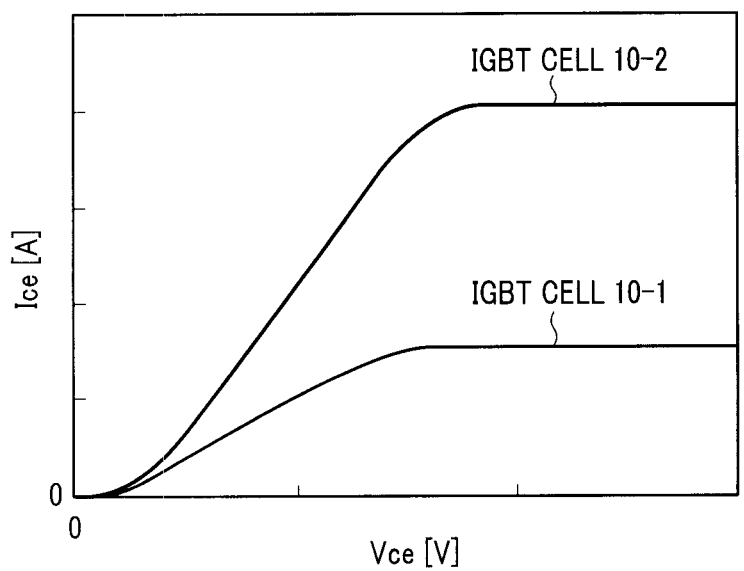
FIG. 5 is a diagram showing a simulation result of collector-emitter current when respective IGBT cells have the same parameter in the equivalent circuit shown in FIG. 4.

More specifically, a parasitic resistor exists in the emitter electrode 22, and thus a resistance component in a traverse direction (hereinafter referred to as "aluminum electrode resistor Rp") occurs between the connection portion 34 of the bonding wire 32 and the IGBT cell 10-1 far away from the connection portion 34 of the bonding wire 32 as shown in FIG. 3. At this time, an equivalent circuit for the IGBT cell 10-1 far away from the connection portion 34 of the bonding wire 32 and the IGBT cell 10-2 just below the connection portion 34 is shown in FIG. 4. When this equivalent circuit is subjected to a simulation based on analysis software for electronic circuits, it is indicated that a large difference occurs in collector-emitter current Ice between the IGBT cells 10-1 and the 10-2, and large collector-emitter current Ice flows in the IGBT cell 10-2 just below the connection portion 34.

That is, the collector-emitter current Ice is represented by the following formula (1) when a coefficient associated with (related to or representing) the surface MOS mutual conductance of the IGBT cell 10 is represented by KP, a threshold value is represented by VT and an electric field coefficient in the traverse direction is represented by θ[1/V].

$$Ice = \frac{KP \cdot (V_{ge} - VT)^2}{2 \cdot (1 + \theta \cdot (V_{ge} - VT))} \quad (1)$$

Here, it is assumed that the collector-emitter current Ice1 flows in the IGBT cell 10-1 which is far away from the connection portion 34 of the bonding wire 32 in the semiconductor device as shown in FIG. 3. At this time, when the gate-emitter voltage applied to the gate electrode 20 of the IGBT cell 10-1 is represented by Vge1, the gate-emitter voltage Vge2 applied to the gate electrode 20 of the IGBT cell 10-2 just below the bonding wire 32 increases to be larger than the gate-emitter voltage Vge1 of the IGBT cell 10-1 by the amount corresponding to the product Rp×Ice1 (Rp represents the aluminum electrode resistance and Ice1 represents the collector-emitter current flowing through the IGBT cell 10-1). As a result, in the IGBT cell 10-2, the gate-emitter voltage Vge contained in the formula (1) is larger than that of the IGBT cell 10-1, and thus larger collector-emitter current Ice2 occurs in the IGBT cell 10-2.

When a gate wire 35 of the gate pad 4 is connected to a neighborhood of the IGBT cell 10-1 which is far away from the connection portion 34 of the bonding wire 32, the connection portion 36 of the gate wire 35 is set to a reference potential (0V), and thus the gate-emitter voltage Vge1 is substantially equal to the gate driving voltage Vg as a set value.

The above phenomenon will be described with reference to FIGS. 6A and 6B.

Figure 6A:
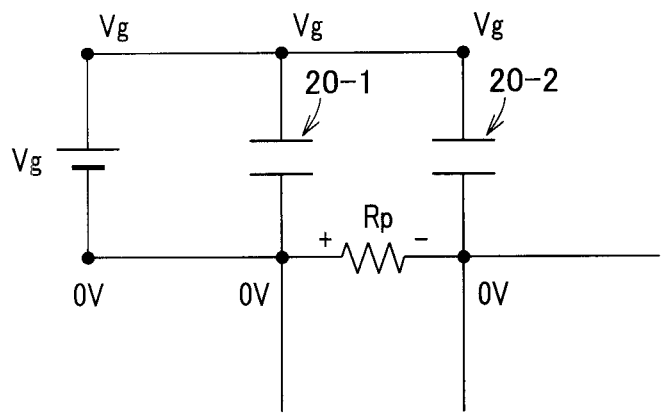
FIGS. 6A and 6B are diagrams showing increase of the gate-emitter voltage of an IGBT cell caused by parasitic resistance of an emitter electrode.
Figure 6B:
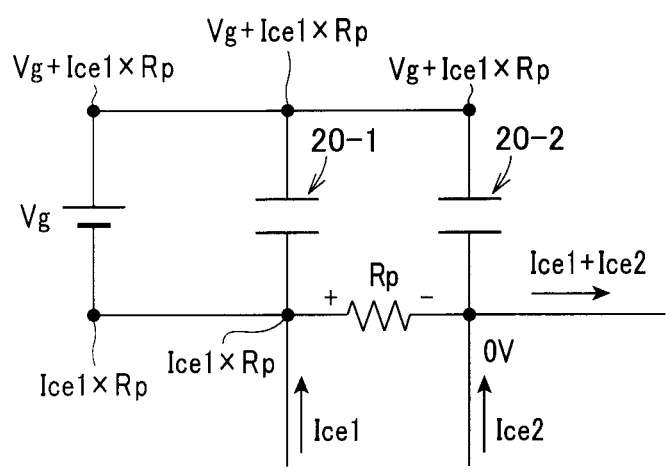

FIG. 6A shows a circuit diagram when a predetermined gate driving voltage Vg is applied to each of the gate electrodes 20-1 and 20-2 of the IGBT cells 10-1 and 10-2 in parallel while no collector-emitter current flows, and FIG. 6B shows a circuit diagram when collector-emitter current flows. Here, it is assumed that the collector-emitter current Ice1 flows into the IGBT cell 10-1 under the above state. Here, when the potential of the connection portion 34 of the bonding wire 32 is set to a reference potential (0V), the potential at the IGBT cell 10-1 side increases by only the amount corresponding to the voltage drop (that is, Ice1×Rp) at the aluminum electrode resistor Rp, and at this time the circuit state shown in FIG. 6A is shifted to the state of the circuit shown in FIG. 6B. Under this state, the potential of Vg+Ice1×Rp is applied to the high voltage side of each of the gate electrodes 20-1, 20-2 of the IGBT cells 10-1, 10-2.

With respect to the IGBT cell 10-1, the potential at the low voltage side thereof is equal to Ice1×Rp, and thus the potential difference across the gate electrode 20-1 is equal to Vg, and thus no variation occurs in the substantial applied voltage. On the other hand, with respect to the IGBT cell 10-2, the potential at the low voltage side thereof is set to the reference (0V) because the IGBT cell 10-2 is located just below the connection portion of the boding wire, and thus the potential difference across the gate electrode 20-2 is equal to Vg+Ice1×Rp, and thus the applied voltage is increased by only the amount corresponding to the voltage drop at the aluminum electrode resistor Rp. Accordingly, the collector-emitter current Ice2 of the IGBT cell 10-2 is increased.

On the other hand, according to this embodiment, even when a difference occurs between the gate-emitter voltages Vge1 and Vge2 of the respective IGBT cells 10-1 and 10-2, the collector-emitter current Ice1 and the collector-emitter current Ice2 are set to be equal to each other by the following method.

That is, as shown in the formula (1), the collector-emitter current Ice also varies in accordance with a coefficient Kp which is related to or represents the surface MOS mutual conductance. According to this embodiment, the mutual conductance is varied by varying the coefficient Kp, whereby the collector-emitter current Ice1 is made equal to the collector-emitter current Ice2.

Specifically, in a case where the collector-emitter current Ice1 of the IGBT cell 10-1 is made to be equal to the collector-emitter current Ice2 of the IGBT cell 10-2, when the coefficients Kp of the IGBT cells 10-1 and 10-2 are represented by Kp1 and Kp2 respectively and the gate-emitter voltages Vge thereof are represented by Vge1 and Vg2 respectively, Vge1=Vg, Vge2=Vg+Ice1+Rp, and the coefficient Kp2 is a constant (actual measurement value), and thus on the basis of the formula (1), the coefficient Kp1 with which Ice1=Ice2 is satisfied is determined from the following formula (2).

$$KP1 = \frac{\{2(1 + \theta \cdot (Vge - VT)) \cdot 1 - (Vge - VT) \cdot (KP2 \cdot Rp - \theta) - \sqrt{\{(Vge - VT) \cdot (KP2 \cdot Rp - \theta) - 1\}^2 - KP2 \cdot Rp \cdot (KP2 \cdot Rp - 2\theta) \cdot (Vge - VT)^2\}}}{(Vge - VT)^2 \cdot (KP2 \cdot Rp - 2\theta) \cdot Rp} \quad (2)$$

Figure 8A:
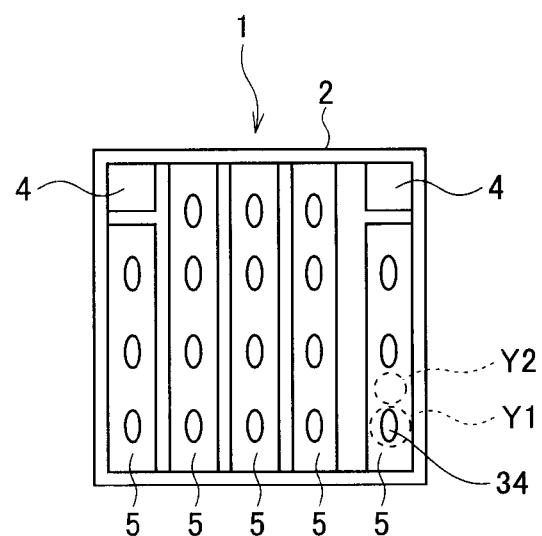
FIGS. 8A, 8B and 8C are diagrams showing the structure of an N emitter layer for which the coefficient Kp is adjusted.

Furthermore, the coefficient Kp is represented by the following formula (3) when the surface mobility of the surface MOS transistor is represented by μs, the oxide film capacity of the IGBT cell 10 is represented by Cox, the channel length of the IGBT cell 10 is represented by Lch (FIG. 3) and the emitter width (channel depth, channel width) of the IGBT cell 10 is represented by Zch (FIG. 8). According to this formula (3), it is apparent that the rate (ratio) of the N emitter layer 16 occupying the unit area of the P base layer 14 (this occupancy rate or ratio of the N emitter layer 16 will be hereinafter referred to as "N emitter rate") is varied by varying the emitter width Zch, thereby the coefficient Kp is adjustable.

$$KP = \frac{\mu s Cox Zch}{Lch}(1 + \theta(Vge - VT)) \quad (3)$$

Figure 7:
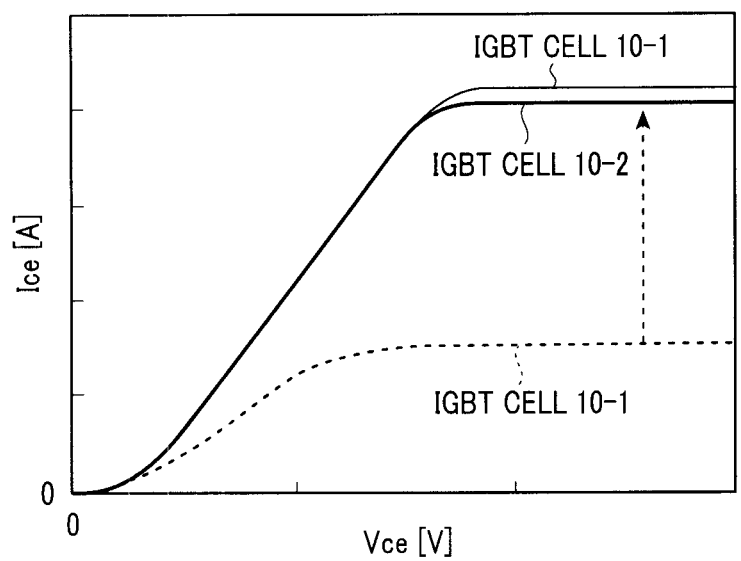
FIG. 7 is a diagram showing a simulation result of collector-emitter current when a coefficient Kp of each IGBT cell is adjusted in the equivalent circuit shown in FIG. 4.

That is, the N emitter rate of the IGBT cell 10-1 for which the coefficient Kp1 is calculated according to the formula (2)

is determined according to the formula (3), and the N emitter layer 16 of the IGBT cell 10-1 is constructed on the basis of the N emitter rate. Accordingly, the collector-emitter current Ice1 of the IGBT cell 10-1 can be made equal to the collector-emitter current Ice2 as shown in FIG. 7, and the current distribution in the semiconductor device 1 can be made uniform.

In the actual semiconductor design, the collector-emitter current Ice2 for the IGBT cell 10-2 just below the connection portion 34 of the bonding wire 32 is first set on the basis of a required short-circuit resistance (i.e., to the extent that the IGBT just below the connection portion is not broken), and the N emitter rate of the IGBT cell 10-2 is determined on the basis of this collector-emitter current Ice2.

With respect to the other IGBT cells containing the IGBT cell 10-1 which are far away from the IGBT cell 10-2 just below the connection portion 34 of the bonding wire 32, the coefficients Kp of these IGBTs (containing the coefficient Kp1 of the IGBT 10-1) are calculated on the basis of the formula (3) in accordance with the distance from the connection portion 34 of the bonding wire 32, and the emitter rates of these IGBTs are determined on the basis of the coefficients Kp. That is, the emitter rate of the IGBT 10-1 is determined on the basis of the coefficient Kp1).

Here, the aluminum electrode resistance Rp is a factor associated with the distance concerned. For example, the aluminum electrode resistance Rp may be regarded as being substantially proportional to the distance from the connection portion 34 of the bonding wire 32. In other words, the distance concerned may be defined on the basis of the value of the aluminum electrode resistance Rp.

For example, it is assumed that the coefficient Kp1 at a place Y2 (see FIG. 8) distant from the connection portion 34 by 1 mm is determined as Kp1=35.6[A/V$^2$] when the thickness of the emitter electrode 22 is equal to 4 μm and the width of the contact opening 24 of the emitter electrode 22 is set to 2 mm. In this case, when the emitter rate of the IGBT cell 10-2 at the place Y1 (see FIG. 8) just below the connection portion 34 is equal to 50% and the coefficient Kp2 is equal to 20[A/V$^2$], for example, the emitter rate of the IGBT cell 10-1 at the place Y2 which is distant from the connection portion 34 by 1 mm is determined as 50(%)×35.6/20=89% according to the calculating formula of (emitter rate of IGBT cell 10-2)×(coefficient Kp1)/(coefficient Kp2).

Figure 8B:
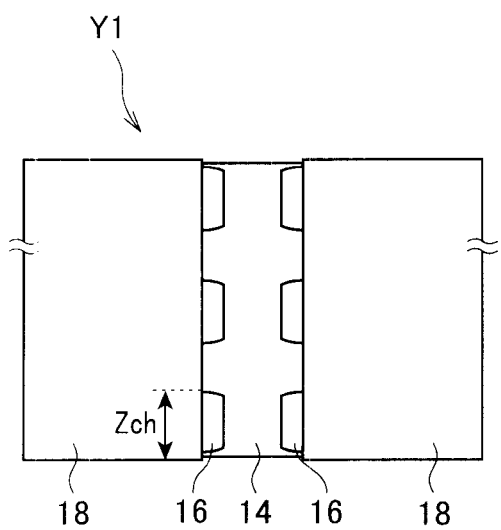
Figure 8C:
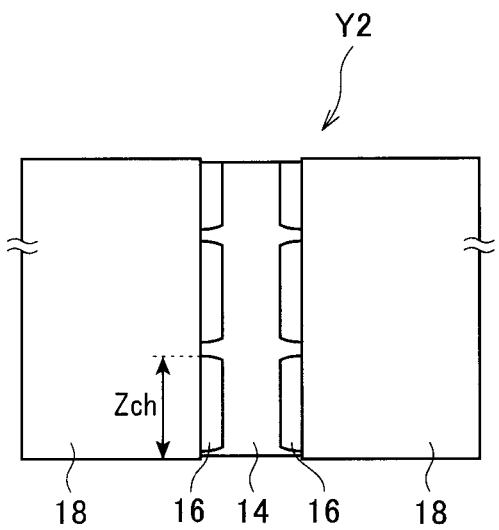

As described above, according to the semiconductor device 1 of this embodiment, after the emitter rate is determined according to the distance from the connection portion 34 of the bonding wire 32, the emitter width Zch of the N emitter layer 16 of each IGBT cell 10 is varied so that the emitter rate corresponds to the distance from the connection portion 34 of the bonding wire 32 as shown in FIG. 8B and FIG. 8C to thereby adjust the coefficient Kp. Accordingly, the collector-emitter current Ice of each IGBT cell 10 is constant irrespective of the distance from the connection portion 34, and thus the current value is not deviated in accordance with the distance from the connection portion 34 and thus a uniform current distribution is obtained.

As described above, according to this embodiment, even when there occurs a difference in gate-emitter voltage Vge in accordance with the distance from the connection portion 34 of the bonding wire 32, the coefficient Kp relating to the mutual conductance of each IGBT cell 10 is varied in accordance with this difference, whereby the collector-emitter current Ice is substantially equal among the respective IGBT cells 10.

Accordingly, the current distribution in the semiconductor device 1 can be made uniform, and the current density at the connection portion 34 of the bonding wire 32 is not higher than that at the other places. Therefore, when latch-up occurs, the IGBT cell just below the connection portion 34 of the bonding wire 32 can be prevented from being broken, and the resistance to latch-up can be enhanced.

Furthermore, it is unnecessary to vary the size of the IGBT cell 10 to make the current density uniform, and thus the circuit design and manufacturing process are not cumbersome.

Furthermore, according to this embodiment, the coefficient Kp associated with the mutual conductance is varied by varying the emitter width Zch or/and the channel length Lch of the IGBT cell 10, and thus the mutual conductance of each IGBT cell 10 can be simply and accurately adjusted.

The present invention is not limited to the above embodiment, and any modification and application can be made without departing from the subject matter of the present invention.

For example, in the above embodiment, the collector-emitter current Ice of each of the IGBT cells other than the IGBT cell 10-2 are made to approach to the collector-emitter current Ice2 of the IGBT cell 10-2 (i.e., the IGBT cell just below the connection portion 34 of the bonding wire 32). However, the present invention is not limited to this style. The collector-emitter current Ice2 of the IGBT cell 10-2 may be made to approach to the collector-emitter current Ice1 of the IGBT cell 10-1 which is far away from the connection portion of the bonding wire). In this case, the coefficient Kp2 which provides Ice1=Ice2 is determined according to the following formula (4). The emitter rate is determined on the basis of the value calculated by this formula (4).

$$kp2 = \frac{2kp1 \cdot (2 \cdot (1 + \theta \cdot (Vge - VT))^2 + Rp \cdot KP1 \cdot \theta \cdot (Vge - VT)^2)}{(2 \cdot (1 + \theta \cdot (Vge - VT)) + Rp \cdot KP1 \cdot \theta \cdot (Vge - VT))^2} \quad (4)$$

Furthermore, it is needless to say that the collector-emitter current Ice of each IGBT cell may be made to approach to a predetermined collector-emitter current Ice so that the collector-emitter current is substantially equal among all the IGBT cells.

In the above embodiment, the coefficient Kp is adjusted on the basis of the emitter width Zch. However, the present invention is not limited to this style, and for example, it may be adjusted by varying the oxide film capacity Cox, the threshold value VT or the channel length Lch of the IGBT cell 10.

What is claimed is:

1. A semiconductor device comprising:
   a plurality of insulated gate type switching cells, each insulated gate switching cell having a base layer, an emitter layer formed in the base layer and a gate electrode formed on the emitter layer through an insulated layer;
   an emitter electrode that is commonly provided to cover the plurality of insulated gate switching cells, the emitter electrode being formed on the emitter layer;
   a bonding wire connected to the emitter electrode, a gate driving voltage being applied to the gate electrode of each insulated gate switching cell so that emitter current flows through the emitter electrode, wherein the emitter layer is configured to have an emitter rate varied in accordance with a distance from a connection portion of the bonding wire to the emitter electrode so that the emitter current flowing through the emitter electrode is substantially equal among the plurality of insulated gate switching cells, the emitter rate being defined by a ratio of an area of the emitter layer to a unit area of the base layer;

and wherein each insulated gate switching cell comprises a base layer, an emitter layer formed in the base layer, the gate electrode formed on the emitter layer through an insulated layer and the emitter electrode formed on the emitter layer, and the mutual conductance of each insulated gate switching cell is varied by varying the emitter rate of the emitter layer in the base layer.

2. The semiconductor device according to claim 1, wherein the emitter rate of the emitter layer in the base layer is varied by varying a preliminarily set width of the emitter layer, and the emitter rate of the semiconductor device corresponds to the preliminarily set width of the emitter layer.

3. The semiconductor device according to claim 2, wherein the emitter width of each insulated gate switching cell is larger as the insulated gate switching cell is farther away from the connection portion.

4. A method of designing a semiconductor device having a plurality of insulated gate switching cells each of which has a base layer, an emitter layer formed in the base layer, a gate electrode formed on the emitter layer through an insulated layer and an emitter electrode which is commonly formed on the emitter layers of the plurality of insulated gate switching cells, and a bonding wire connected to the emitter electrode, a gate driving voltage being applied to the gate electrode of each insulated gate switching cell so that emitter current flows through the emitter electrode, comprising the steps of:

providing the emitter layer in the base layer of each insulated gate switching cell so that emitter rate is varied in accordance with a distance from a connection portion of the bonding wire to the emitter electrode, whereby the emitter current flowing through the emitter electrode is substantially equal among the plurality of insulated gate switching cells, and wherein the emitter rate is defined by a ratio of an area of the emitter layer to a unit area of the base layer.

* * * * *